United States Patent
Stultz et al.

(10) Patent No.: US 7,782,117 B2
(45) Date of Patent: Aug. 24, 2010

(54) CONSTANT SWITCH VGS CIRCUIT FOR MINIMIZING RFLATNESS AND IMPROVING AUDIO PERFORMANCE

(75) Inventors: Julie Stultz, Scarborough, ME (US); Steven M. Macaluso, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 67 days.

(21) Appl. No.: 12/337,709

(22) Filed: Dec. 18, 2008

(65) Prior Publication Data
US 2010/0156521 A1   Jun. 24, 2010

(51) Int. Cl.
*H03K 17/16* (2006.01)
*H03K 17/687* (2006.01)

(52) U.S. Cl. ............... 327/389; 327/427; 327/430; 327/434

(58) Field of Classification Search ............ None
See application file for complete search history.

(56) References Cited

U.S. PATENT DOCUMENTS

| | | | | |
|---|---|---|---|---|
| 3,764,921 A | * | 10/1973 | Huard | 327/93 |
| 4,093,874 A | * | 6/1978 | Pollitt | 327/378 |
| 5,475,332 A | * | 12/1995 | Ishimoto | 327/427 |
| 5,844,440 A | * | 12/1998 | Lenk et al. | 327/322 |
| 6,163,199 A | * | 12/2000 | Miske et al. | 327/434 |
| 7,129,766 B2 | * | 10/2006 | Steinhagen | 327/427 |

* cited by examiner

*Primary Examiner*—Tuan Lam
(74) *Attorney, Agent, or Firm*—Cesari and McKenna, LLP; Edwin H. Paul, Esq.

(57) ABSTRACT

A MOSFET switch is disclosed that is driven on by a circuit that provides a constant gate to source voltage, Vgs, that is independent of the input voltage, the power supply and any logic signals. The constant Vgs is derived from a reference voltage and biases the MOSFET switch such that Ron is constant, or Rflatness is minimized. A minimized Rflatness provides a higher fidelity transfer of audio signals compared to prior art switches where Rflatness is greater.

5 Claims, 1 Drawing Sheet

CONSTANT SWITCH VGS CIRCUIT FOR MINIMIZING RFLATNESS AND IMPROVING AUDIO PERFORMANCE

BACKGROUND OF THE INVENTION

1. Field of the Invention

The present invention relates to a MOSFET switch, and more particularly to a MOSFET switch connecting electronic signals including high fidelity audio, other analog as well as digital signals

2. Background Information

MOSFET devices are preferred switches for coupling electronic signals since they demonstrate no offset voltages that may be found in bipolar and other solid state switches, and MOSFET switch on resistance (Ron) is very low and the off resistance (Roff) is very high. In modern devices Ron may be under one ohm and Roff may be many megohms. Note "coupling" and "couples" as used herein includes direct connections.

In MOSFET switches Ron is a function the gate to source voltage, Vgs, of the device. Since Ron is a function of Vgs, Ron will be reasonably constant if Vgs is constant, other conditions being equal.

When such switch device are used for audio signals, the fidelity of the transferred signal across the switch may be negatively affected if Ron changes with the changing of the input signal voltage level.

One measure of the audio fidelity of a switch may be the total harmonic distortion (THD) that is introduced by the switch. One standard measurement of THD includes measuring signal fidelity near 220 KHz which is the 11$^{th}$ harmonic of the high limit of the standard audio range of 20 Hz to 20 KHz.

Keeping a MOSFET Ron constant despite input signal voltage variations is an object of U.S. Pat. No. 4,093,874, to Pollitt. Pollitt discusses keeping Ron constant by keeping Vgs constant (at a set temperature) regardless of changes of the input signal voltage. Pollitt, however, uses the logic signal voltage value, that turns the switch on/off, to determine the Vgs voltage level. But the logic signal voltage level will change as the power supply voltage (that produces the logic signal voltage) changes with loads. The logic signal value may also change with other loads on the logic signal itself. Such changes in Vgs will change Ron and, also, limit the useful dynamic range of the '874 invention.

SUMMARY OF THE INVENTION

The present invention generates a constant Vgs across an MOSFET switch that is independent of the input signal voltage, the power supply and any logic signal. A MOSFET switch with a constant Vgs provides an on resistance, Ron, that is constant. In the art, Ron changing with respect to the input signal voltage changes may be referred to as Rflatness. To preserve audio fidelity, Rflatness should be very small or zero. That is, as the input signal voltage changes, Ron stays about constant.

In one embodiment a constant reference voltage is arranged to provide a constant Vgs.

Illustratively, an input signal voltage, Vin, generates a current proportional to the input signal voltage by impressing Vin across a precision resistor. A reference voltage, Vref, generates a current proportional to the reference voltage by impressing Vref across a second precision resistor equal to the first. The two proportional currents are summed in a third precise resistor equal to the other two, where the voltage across the third precision resistor is Vin+Vref which is coupled to the gate of the MOSFET switch.

Since the MOSFET source is tied to Vin, it is canceled when the voltage across the gate to source is calculated. That is:

$$Vgs=Vg-Vin=Vin+Vref-Vin=Vref.$$

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
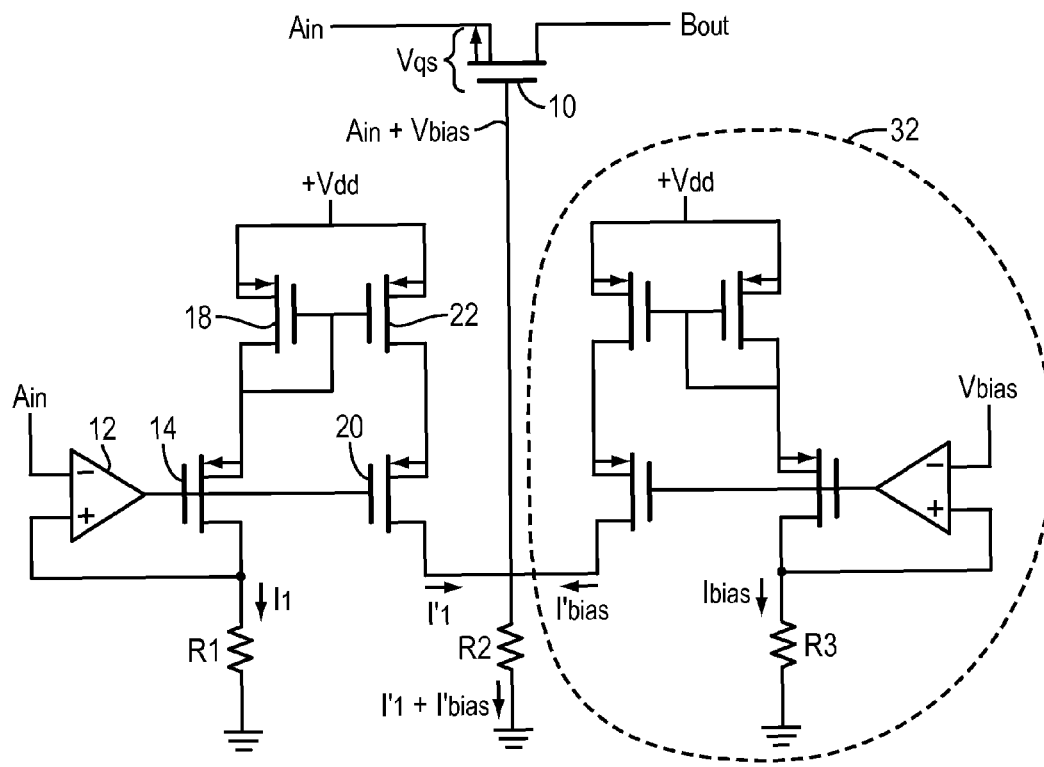
FIG. 1 is schematic illustrating the present invention.

FIG. 1 shows an N-type MOSFET 10 that is a switch that when on transfers an input voltage signal, Ain to an output, Bout. The switch 10 is on when Vgs exceeds a threshold that may be less than about +1.0 V. In the present invention the gate to source voltage, Vgs, of MOSFET 10 is independent of an input signal voltage level, the power supply and any logic signal level.

In FIG. 1, Ain is input to the inverting (−) input of an op amp (operation amplifier) 12 arranged as a unity or +1 gain. The output of op amp 12 drives the gate of P-type MOSFET 14 whose drain is fed back to the op amp 12 non-inverting input. Ain is input to the inverting input because the MOSFET 14 provides a second signal inversion wherein the drain of MOSFET 14 follows Ain. The result is that as Ain rises, the drain of MOSFET 14 rises and thus the non-inverting (+) input 16 of the op amp 12 rises completing the unity gain operation.

The source of MOSFET 14 couples to the drain and gate of MOSFET 18, and the source of MOSFET 18 connects to the local power supply, +Vdd.

The output of the op amp 12 connects to MOSFET 20 that mirrors MOSFET 14. The source of MOSFET 20 couples to the drain of MOSFET 22 that is arranged as a mirror of MOSFET 18. In this circuit the drain current I1 of MOSFET 14 travels through R1, and the mirror I1' travels through R2. R1 and R2 may be of the same value and voltage across R1 will be equal to Ain (due to the op amp 12), and I1' will produce an identical Ain across R2.

The entire circuitry that coupled Ain to R2 is duplicated in the circuitry 32 with Vbias replacing Ain. In the circuitry 32 Vbias produces a current Ibias through R3 and a mirror current I'bias through R2.

The result is that I1' and I'bias both travel through R2 producing a voltage across R2 of Ain+Vbias. The gate of switch 10 is coupled to this Ain+Vbias, and since the source of switch 10 is coupled to Ain, the Vgs of MOSFET 10 is:

$$Vgs=(Ain+Vbias)-Ain; \text{ or } Vgs=Vbias.$$

Note that +Vdd and FETs 14, 18, 20 and 22 must provide the voltage compliance that allows the drain of MOSFET 22 to rise to the sum of Ain and Vbias.

In this embodiment, Vbias is derived from a reference voltage that remains a constant independent of supply voltage and logic signals. In one embodiment, Vbias may be set at +1 V, a voltage level that turns on MOSFET 10. With this Vgs, an analog test signal of about 0.175 V, peak to peak, at 220 KHz passed through the on switch 10 with virtually no attenuation or time lag.

Figure 2:
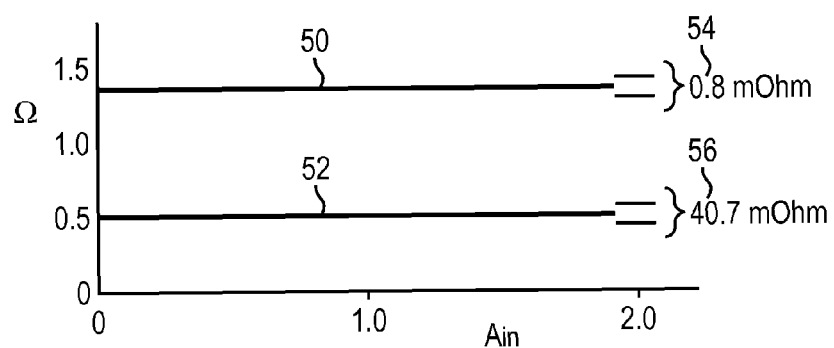
FIG. 2 is a graph of Ron versus the input voltage level.

FIG. 2 illustrated the Ron for an embodiment of the present invention. With Vgs=+1 V, the top trace 50 represents Ron as Ain runs from 0 to +2.0 V. The bottom trace 52 is for a switch operating with a logic signal of about +4 V driving the gate. The horizontal axis is input voltage Ain, and the vertical scale is ohms. In the prior art trace 52, Ron is lower since the Vgs is higher. Note, as discussed above, that for the bottom trace Vgs drops from +4 V to +2 V as the Ain rises from 0 V to +2 V, but for the top trace, Vgs remains constant.

Measuring the change in Ron as the input changes from 0 V to +2 V, Ron changes by 0.77 mΩ 54 for the top trace50, while for the prior art trace 52 Ron changes by +40.7 mΩ 56. An improvement in Rflatness in this embodiment is about 98%.

The N-type MOSFET in the above illustrative embodiment is one example of the present invention and P-types may be advantageously employed in other embodiments.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A switch circuit defining an on state and an off state, the switch circuit when on couples a input node to an output node, the circuit comprising:
   an MOSFET device having a gate, a source coupled to the input node and an drain coupled to the output node; wherein, when the MOSFET device is on, an input voltage signal at the input node is coupled to the output node via the MOSFET device;
   a first circuit comprising: an unity gain amplifier with an input connected to the input voltage signal and an output providing the input voltage signal;
   a bias circuit comprising: an unity gain amplifier with an input connected to a bias voltage signal and an output providing the bias voltage signal;
   a signal summing circuit that accepts both outputs of the first circuit and the bias circuit and outputs a gate drive voltage equal to the sum of the outputs of the first circuit and the bias circuit; wherein the gate drive voltage signal is coupled to the MOSFET device gate.

2. The switch circuit of claim 1 further comprising:
   a first resistor connected to the output of the first circuit, the first resistor carrying a current, I1, equal to the input voltage signal divided by the first resistor;
   a second resistor connected to the output of the bias circuit, the second resistor carrying a current, Ibias, equal to the bias voltage signal divided by the second resistor;
   a first current mirror outputting a mirror of I1;
   a second current mirror outputting a mirror of Ibias; and wherein the signal summing circuit comprises a third resistor that is arranged to accept the first and the second mirror currents.

3. The switch circuit of claim 2 wherein the resistance value of the first, the second and the third resistors are equal to each other.

4. The switch circuit of claim 1 wherein the first circuit the unity gain amplifier comprises:
   a first operational amplifier with its inverting input connected to the input voltage signal;
   a first MOSFET with its gate coupled to the first operational amplifier output and its drain connected back to the unity gain non-inverting input;
   a first resistor connected to the first MOSFET drain wherein a first current, I1, flows from the drain of the first MOSFET through the first resistor;
   a second MOSFET coupled to minor I1 and provide I1';
and the bias circuit unity gain amplifier comprises:
   a second operational amplifier with its inverting input connected to the bias voltage signal;
   a third MOSFET with its gate coupled to the second operational amplifier output and its drain connected back to the second unity gain non-inverting input;
   a second resistor connected to the third MOSFET drain wherein a bias current, Ibias, flows from the drain of the third MOSFET through the second resistor;
   a fourth MOSFET coupled to mirror Ibias and provide I'bias; and wherein the signal summing circuit comprises a third resistor that is arranged to accept I1' and the I'bias and outputs the gate drive voltage signal to the MOSFET device gate.

5. A method for driving the gate of an MOSFET switch, the MOSFET switch, when on, couples a input node voltage to an output node, the method comprising the steps of:
   unity amplifying the input node voltage to provide a unity gain output that is equal to the input node voltage;
   coupling the unity gain output to a first resistor to produce a first current, I1;
   unity amplifying a bias voltage input to provide a bias output that is equal to the bias voltage input;
   coupling the bias output to a second resistor to produce a bias current, Ibias;
   mirroring I1 and Ibias to produce I1' and I'bias, respectively;
   summing I1' and I'bias through a third resistor to produce a gate drive signal; and
   coupling the gate drive signal to the MOSFET switch gate.

* * * * *